United States Patent [19]
Pio et al.

[11] Patent Number: 5,597,750
[45] Date of Patent: Jan. 28, 1997

[54] METHOD OF MANUFACTURING A MATRIX OF MEMORY CELLS HAVING CONTROL GATES

[75] Inventors: Federico Pio; Carlo Riva; Silvia Lucherini, all of Milan, Italy

[73] Assignee: SGS-Thomson Microelectronics S.r.l., Agrate Brianza, Italy

[21] Appl. No.: 474,735

[22] Filed: Jun. 7, 1995

Related U.S. Application Data

[62] Division of Ser. No. 282,148, Jul. 28, 1994.

[30] Foreign Application Priority Data

Jul. 29, 1993 [EP] European Pat. Off. ........... 93830339.3

[51] Int. Cl.⁶ ........................................... H01L 21/8247
[52] U.S. Cl. ................................... 437/43; 437/52
[58] Field of Search ............................... 437/43, 52

[56] References Cited

U.S. PATENT DOCUMENTS

| | | | |
|---|---|---|---|
| 4,766,088 | 8/1988 | Kono et al. | 437/43 |
| 5,022,001 | 6/1991 | Kowalski | 365/185 |
| 5,081,054 | 1/1992 | Wu et al. | 437/43 |
| 5,105,386 | 4/1992 | Andoh | 365/185 |
| 5,188,976 | 2/1993 | Kume et al. | 437/43 |
| 5,216,633 | 6/1993 | Weon | 365/185 |
| 5,363,330 | 11/1994 | Kobayashi | 365/185 |
| 5,365,484 | 11/1994 | Cleveland | 365/185 |

FOREIGN PATENT DOCUMENTS

| | | | |
|---|---|---|---|
| 0182198A3 | 11/1985 | European Pat. Off. | H01L 29/08 |
| 0326465A1 | 8/1989 | European Pat. Off. | H01L 27/10 |
| 62-60266A | 3/1987 | Japan | H01L 29/78 |
| WO89/06429 | 12/1988 | WIPO | G11C 11/40 |

OTHER PUBLICATIONS

G. Yaron, et al., "A 16K E²PROM Employing New Array Architecture and Designed–In Reliability Features," *IEEE Journal of Solid–State Circuits*, vol. SC–17. No. 5, 1982.

*Primary Examiner*—H. Jey Tsai
*Attorney, Agent, or Firm*—David V. Carlson; Harry K. Ahn; Seed and Berry LLP

[57] ABSTRACT

A circuit structure for a matrix of EEPROM memory cells, being of a type which comprises a matrix of cells including plural rows and columns, with each row being provided with a word line and a control gate line and each column having a bit line; the bit lines, moreover, are gathered into groups or bytes of simultaneously addressable adjacent lines. Each cell in the matrix incorporates a floating gate transistor which is coupled to a control gate, connected to the control gate line, and is connected serially to a selection transistor; also, the cells of each individual byte share their respective source areas, which areas are structurally independent for each byte and are led to a corresponding source addressing line extending along a matrix column.

19 Claims, 4 Drawing Sheets

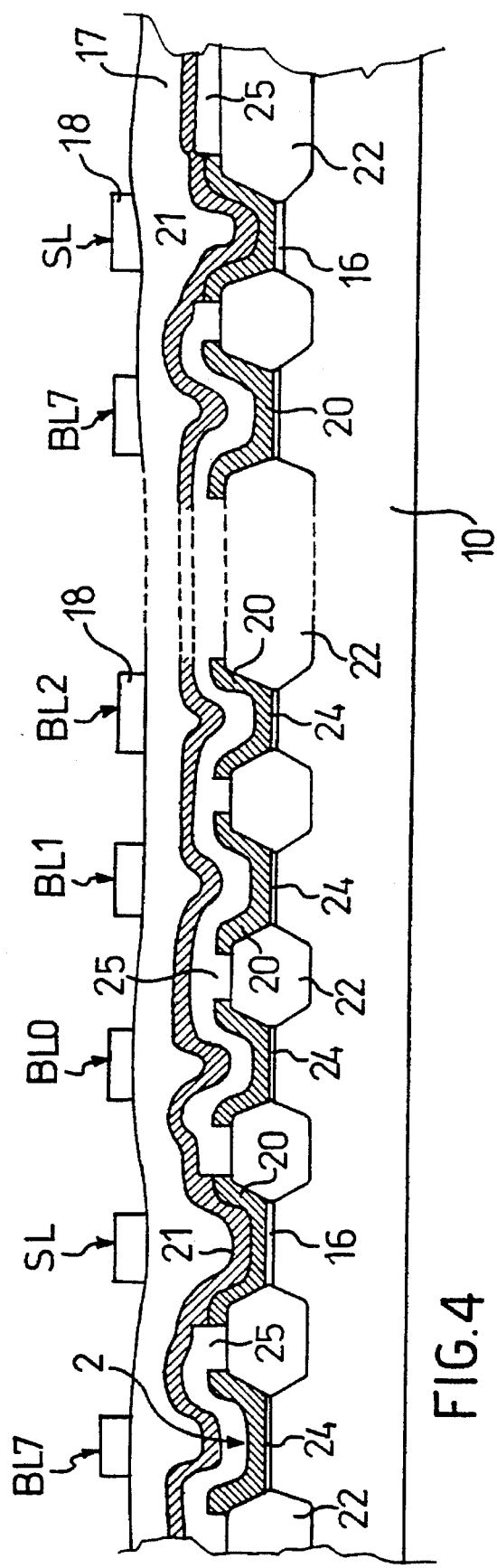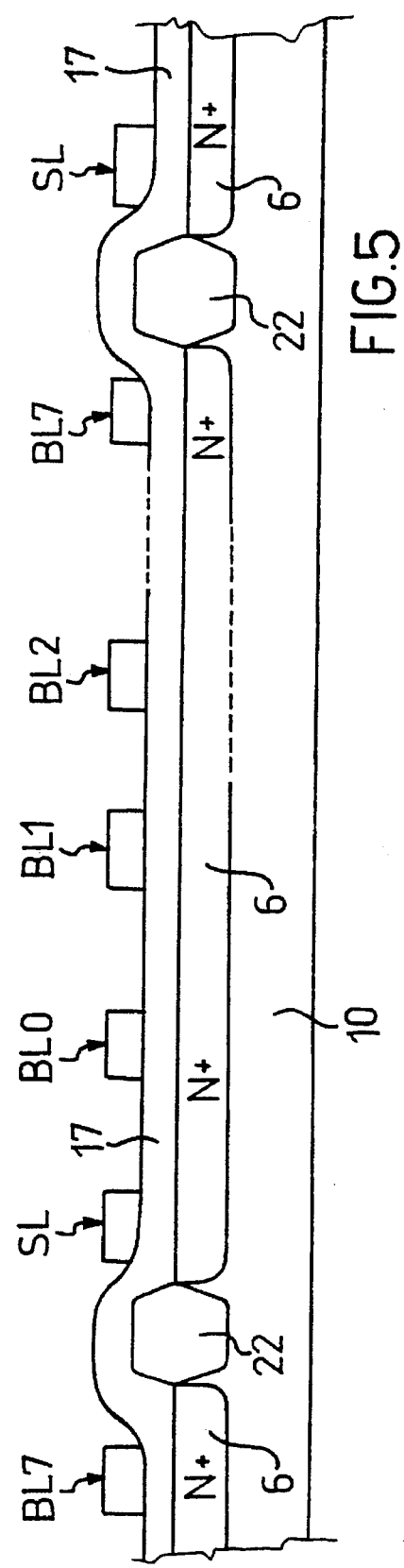
FIG.4
FIG.5

METHOD OF MANUFACTURING A MATRIX OF MEMORY CELLS HAVING CONTROL GATES

RELATED APPLICATIONS

This application is a divisional application of application Ser. No. 08/282,148 filed Jul. 28, 1994.

FIELD OF THE INVENTION

This invention relates to a circuit structure for a memory cells matrix, and more particularly, to a matrix layout of EEPROM memory cells.

BACKGROUND OF THE INVENTION

As is well known, EEPROM memory structured, while being non-volatile types, allow the information contained therein to be modified electrically at both the write and the erase phases of their operation. Furthermore, they distinguish themselves by the kind of their electric programming, which may take place in either the "page" mode or the "byte" mode.

In the former mode, all the cells in one row of the matrix are addressed at one time. In the latter mode, one byte only is addressed of the several available in one row.

It is also known that the state of any cell in the EEPROM memory can be altered by means of electron flow passing by tunnel effect through a thin layer of silicon oxide associated with the floating gate of the cell. The thin oxide region occupies a smaller area than the floating gate, where the electric charge is stored.

There exist different types of EEPROM memory cells which are identifiable by the number of their polysilicon layers.

In fact, there are cells with single, double, or triple layers of polysilicon. Most commonly employed are cells with two-level of polysilicon, known as FLOTOX cells Such cells are described, for instance, in an article "Oxide reliability criterion for the evaluation of endurance performance of electrically erasable programmable read-only memories", *Journal App. Phys.*, 71, No. 9, 1992.

Irrespective of the number of the polysilicon layers, for the write and erase phases of the cells, it is common practice to use positive voltages, applied to the diffusion underlying the tunnel region or the control gate. Such voltages vary between 8 and 18 volts, in order to generate across the thin oxide an electric field which is sufficiently strong to positively trigger the tunnel effect.

However, the use of such comparatively high positive voltages may result over time in the thin oxide layer being deteriorated, thereby damaging the cells and the whole memory structure beyond repair.

One might think of obviating this problem by using negative voltages for programming, e.g., during the writing phase.

However, with conventional type cells, byte mode programming is carried out by splitting the control gate into segments which are common to a single byte (e.g., eight or sixteen bits). The control gate is then selected by means of a column decoder external of the cells matrix, and is enabled by a select transistor shared by all the cells in one row. In this way, the programming will only be enabled in the selected byte.

But the use of a negative voltage during this programming phase may create some serious problems. As an example, a large integrated circuit area would have to be used for selecting a single byte, because each segment of the control gate requires the arrangement of a switch adapted to handle both the positive voltages and the negative voltages applied during the programming phase.

SUMMARY OF THE INVENTION

An object of this invention is to provide a circuit structure and methods for its manufacture and programming for a matrix of memory cells of the EEPROM type which has such structural and functional features as to improve the memory reliability and extend its service life, while attenuating the deterioration of the tunnel oxide and obviating the programming problems when using negative voltages.

A further object of the invention is to provide very high density integrated storage circuits which can occupy, for a given technology, a smaller circuit area than comparable circuits of conventional design. This would enable the manufacturing costs of high density storage circuits to be cut down drastically.

According to principles of the present invention, the source line is split into regular segments shared by the cells of a single byte (having eight or sixteen bits, for example) and decoding such segments when a desired byte is programmed.

The EEPROM memory includes a group of cells arranged in a matrix composed of rows and columns, each provided with a word line and a bit line respectively, wherein the bit lines are gathered into groups or bytes of adjacent lines which are simultaneously addressable. Each of said cells incorporates a floating gate transistor connected serially to a selection transistor and has an additional control gate overlaying the floating gate.

According to the invention, a circuit structure of the kind outlined above and as defined in the characterizing part of claim 1 is provided.

BRIEF DESCRIPTION OF THE DRAWINGS

The features and advantages of a circuit structure according to the invention will become apparent from the following detailed description of an embodiment thereof, given by way of example and not of limitation with reference to the accompanying drawings.

FIG. 4 is an enlarged schematic view in vertical section, taken along line IV—IV in FIG. 2, of a semiconductor portion in which the circuit of this invention is formed.

FIG. 5 is an enlarged schematic view in vertical section, taken along line V—V in FIG. 2, of a semiconductor portion in which the circuit of this invention is formed.

DETAILED DESCRIPTION OF THE INVENTION

Figure 1:
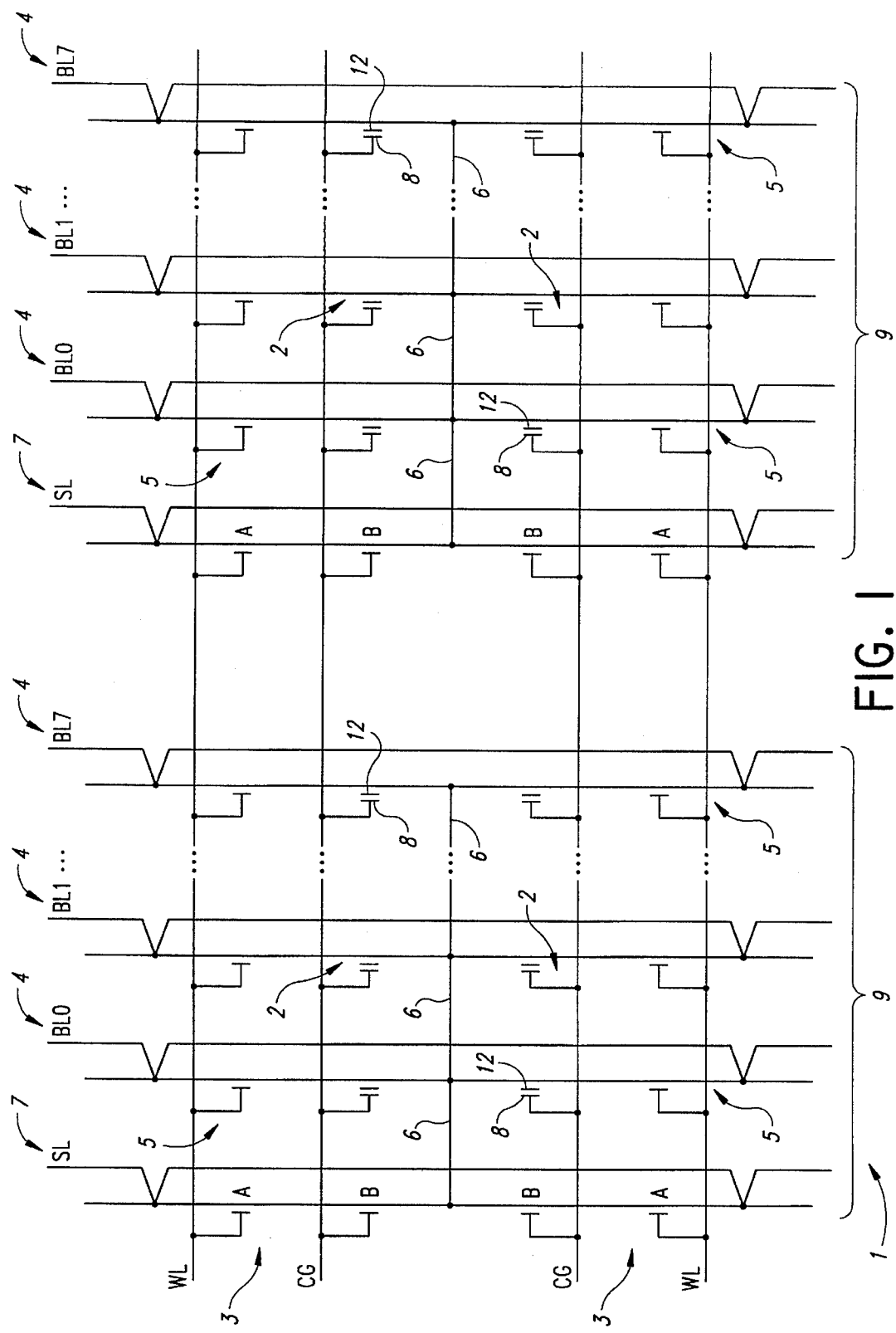
FIG. 1 is a diagrammatic view of a circuit structure embodying this invention.

With reference to the drawing views, generally and schematically shown at 1 is a circuit structure for forming, in accordance with the invention, a matrix of memory cells 2, in particular, EEPROM memory cells.

The structure 1 is constructed in the form of a semiconductor integrated circuit incorporating thousands of cells 2. Shown diagrammatically in FIG. 1 is, however, just a portion of this circuit.

The matrix provided by the structure 1 comprises a plurality of rows 3 and a plurality of columns 4. Each row 3 includes a word line WL and a corresponding control gate line CG. On the other hand, the columns 4 include the bit lines of the matrix.

According to the memory size, the bit lines BL are gathered into bytes 9, —into groups of eight $BL_0, \ldots, BL_7$ or sixteen adjacent lines which can be addressed simultaneously.

At the crossover of a word line WL with a bit line BL, there is a selection transistor 5. In addition, a bit line BL interconnects all the drain terminals of the common selection transistors 5 on a given column 4 of the matrix.

Each selection transistor 5 is associated with and connected serially to a floating gate EEPROM cell 2.

Figure 2:
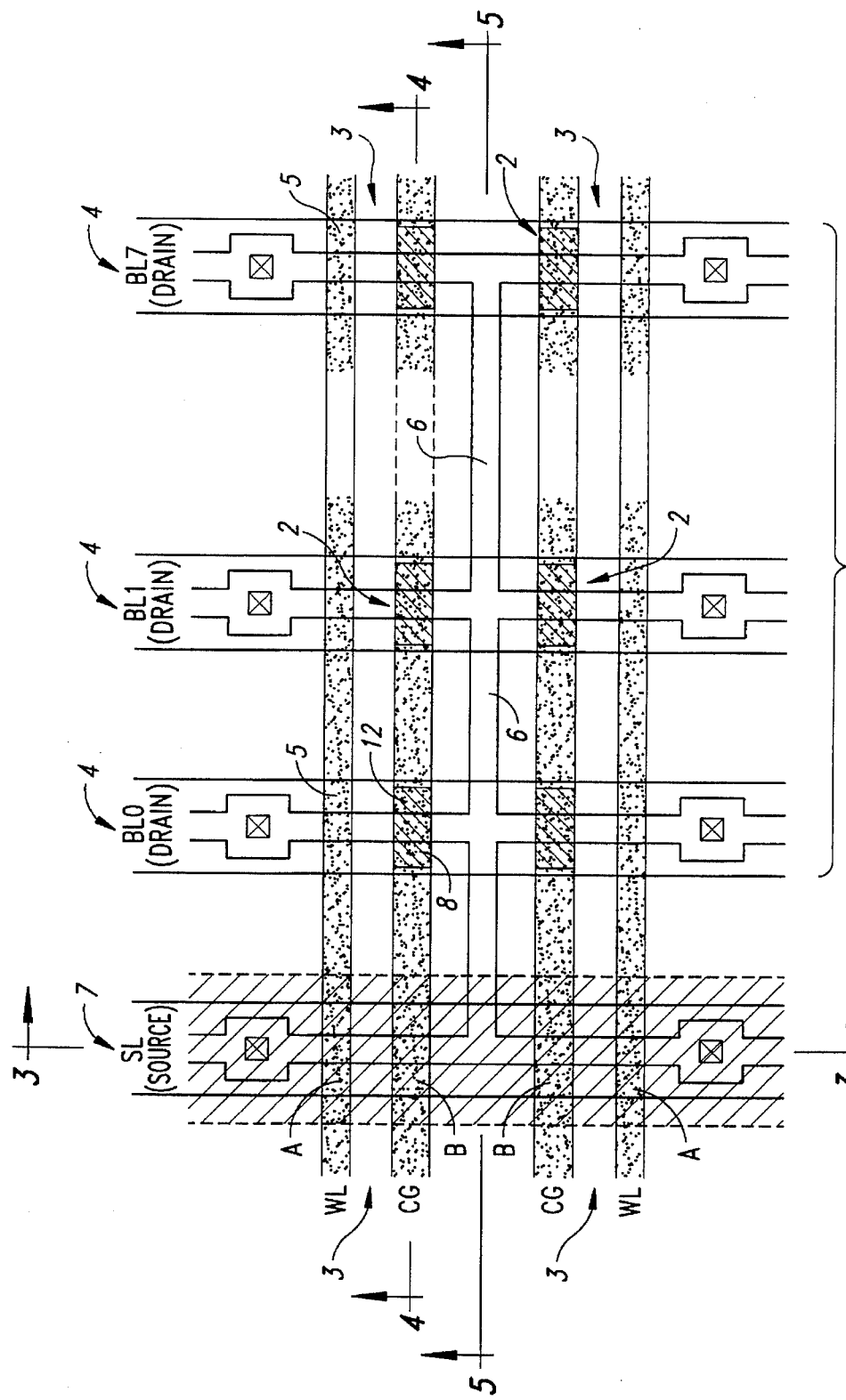
FIG. 2 is an enlarged schematic view from above of a semiconductor portion in which the inventive circuit structure is formed.

Specifically, the cell 2 is of the type with a double level of polysilicon. The core of the memory cell 2 comprises a MOS transistor having a floating gate 12 where the electric charge is stored identifying the two different ("written" or "erased") states of the cell. The floating gate is shown in FIG. 2.

In general, the cell 2 includes a second, or control, gate 8, which is coupled capacitively to the floating gate 12 through an intervening dielectric layer called "interpoly." A voltage is transferred through said dielectric layer to the floating gate 12 from the control gate 8 during the write and/or erase phases of the cell 2.

The control terminal of the control gate 8 is shared by all the cells 2 which form any one row 3 in the structure 1. Each row 3 of the matrix 1 is provided, to that aim, with a dedicated connection line CG interconnecting the gates 8.

According to the present invention, the structure 1 further comprises plural source addressing columns 7, each associated with a corresponding byte 9. Such column 7 are also referred to as source addressing lines SL.

In the embodiment described herein by way of example, the source addressing lines SL are each connected between each pair of adjacent bytes 9, that is, a column 7 is provided for each group of bit lines BL forming a byte 9.

Nothing forbids, however, providing such source addressing lines SL between the bit lines BL. And in one embodiment, the source addressing lines SL are provided in between the bit lines BL.

Each source addressing line SL connects the source terminals of a series of enable transistors A and B aligned on one column.

The transistors denoted by A are provided at the crossover of each word line WL with the column 7, where the transistors denoted by B are provided at the crossover of each connection line CG connecting the control gates 8 to the column 7.

According to the present invention, the source terminals of all the transistors incorporated in the cells 2 of a single byte 9 are led to one and the same corresponding source addressing line SL.

This results in the source addressing line SL in effect being split into segments, each in common with the source regions 6 of the cells 2 which form a single byte 9.

From the practical embodiment illustrated by FIG. 2, all the cells 2 of a given byte 9 have respective source regions formed in common with a corresponding one of the source addressing lines SL. Additionally, the source regions of the symmetrical byte with the above—i.e. the byte in the next row 3—would also be in common. Nothing forbids, however, providing source regions of the symmetrical byte independently connected to the source addressing line SL, and this is possible in one embodiment.

The enable transistors A and B present in the source addressing line SL are not strictly necessary, although their provision has the advantage of minimizing noise, as explained hereinafter.

The transistors A are intended for selecting the segment of that source addressing line SL in the row 3 which would be addressed when accessing the memory structure. Each transistor A is driven from its respective word line WL and could be of a high voltage type if higher source voltages should be required to inhibit the erasing of non-addressed bytes.

The transistors B are additional enable transistors. They are driven from their respective connection line CG and should be a high-voltage type in order to withstand the voltages that are applied during the erase phase.

Each transistor B only represents a small increase in the series resistance of its respective source addressing line SL. This resistance may be minimized, if desired, by appropriate selection of the transistor B length and width or even removed altogether by shorting the transistors with an implant or a connecting bridge of polysilicon or metal.

The method for programming the memory cell of this invention will now be described. In fact, the peculiar and innovative structure of this cell 2 allows it to be programmed in quite a novel manner.

In conventional storage circuits, positive voltage pulses are usually employed for writing and erasing a given cell. These pulses are applied to the cell terminals such that a sufficient electric field is generated to induce a flow of current through the tunnel oxide layer.

By contrast, the memory structure of the present invention provides for the use of a negative voltage, to be applied to the control gate 8 of each predetermined cell 2 during the write phase.

Specifically, during the write phase, the voltages shown in Table I are applied to a selected byte at the various terminals.

Throughout the following tables are shown—for each write, erase, or read phase—the voltage values on the source addressing line SL, the bit line BL (drain contact), the word line WL (gate of the select transistor), and the control gate 8.

The voltage at the control gate 8 is decoded by rows, as is the voltage applied to the gate of the selection transistor 5. The voltage at the drain terminal is, on the other hand, decoded by columns, as is the voltage at the source terminals of the source addressing line SL.

The erase and read phases for the selected byte are run in a similar manner, with the difference that no negative voltages are applied here to the various terminals.

If no enable transistors A and B are provided, the voltage on the word line during the erase phase may be zero.

Table II, on the other hand, shows the voltage values applied to a byte which has not been selected but is present in the same row as the selected byte.

Likewise, Table III shows the voltage levels applied to a byte which has not been selected but is present in the same column as the selected byte.

TABLE I

Selected byte

| | $V_{SOURCE}$ [V] | $V_{DRAIN}$ [V] | $WL_{select\ tr.}$ [V] | $V_{CG}$ [V] |
|---|---|---|---|---|
| WRITE | float | 5 | 6 | −8 |
| ERASE | 0 | float | 6 | 16 |
| READ | 0 | 1 | 5 | 3 |

TABLE II

Unselected byte in the same row as the selected byte (same WL and CG).

| | $V_{SOURCE}$ [V] | $V_{DRAIN}$ [V] | $WL_{select\ tr.}$ [V] | $V_{CG}$ [V] |
|---|---|---|---|---|
| WRITE | float | float | 6 | −8 |
| ERASE | 5 | float | 6 | 16 |
| READ | float | float | 5 | 3 |

TABLE III

Unselected byte in the same column as the selected byte. (Same decoding as the source.)

| | $V_{SOURCE}$ [V] | $V_{DRAIN}$ [V] | $WL_{select\ tr.}$ [V] | $V_{CG}$ [V] |
|---|---|---|---|---|
| WRITE | float | 5 | 0 | 0 |
| ERASE | 0 | float | 0 | 0 |
| READ | float | float | 0 | 0 |

TABLE IV

Unselected byte in different row and column from the selected byte.

| | $V_{SOURCE}$ [V] | $V_{DRAIN}$ [V] | $WL_{select\ tr.}$ [V] | $V_{CG}$ [V] |
|---|---|---|---|---|
| WRITE | float | float | 0 | 0 |
| ERASE | 5 | float | 0 | 0 |
| READ | float | float | 0 | 0 |

In either case, the polarizations applied to the various terminals are transferred in the same way as previously described; that is, the control gate decoding is carried out by rows, whereas the decoding of the drain and the source terminals is carried out by columns.

The write phase is characterized by the use of a negative voltage at the control gate 8 and a positive voltage at the drain terminal of the cell 2. This allows generation of a sufficiently strong electric field to draw electrons from the floating gate 12. However, this operation does impose some noise on all the cells in one row 3.

In fact, the negative voltage is also applied to their control gates 8, which are in common with the connection line CG for all the cells in the same row 3.

This noise may be difficult to suppress in the byte programming mode, but the effect of the noise is minimized by appropriate adjustment of the values of the applied voltages.

During the erase phase, the voltage Vs=0 on the source column SL is taken from that column to the source terminals of the cells 2 which belong to the selected byte 9. In fact, both the transistor A and the transistor B are conducting, and each cell 2 of the selected byte 9 is injected by electrons at the floating gate 12 through the channel region.

However, in order to prevent erasing of bytes not yet selected but placed in the same row 3, the source lines SL of the unselected columns 7 are brought to a voltage of 5 volts.

Here again, the voltage is transferred to all the source segments related to each byte because the transistors A and B are conducting.

In this way, the electric field across the tunnel oxide will not be sufficiently strong to significantly trigger a Fowler-Nordheim conduction mechanism. Accordingly, the information stored in the cells of these unselected bytes is left unaltered.

Additionally, all the bytes in rows other than the selected one will be unaffected by the erase and write operations because no voltages, either positive or negative, with a sufficiently high value are applied to their control gates. No noise from the comparatively low voltage applied to the source columns SL during the erase phase appears on the bytes of the unselected rows, because the transistor A is cut off during this phase and no voltage is transferred to the source terminals, thereby allowing them to float.

The read phase is run in a conventional manner.

With reference to the examples of FIGS. 2 to 5, the steps of the manufacturing method which lead to the formation of a semiconductor integrated device incorporating the circuit structure of this invention will now be described.

Specifically, the process steps will be described below leading to a circuit also incorporating the transistors A and B for the source addressing line SL.

The cells 2 in the matrix 1 are implemented using MOS technology, starting with a P-doped semiconductor substrate 10, which has been formed with either N-type or P-type wells.

The description to follow begins with the step of photolithographically defining active area regions on the substrate 10. Among these active areas, the common source regions 6 of cells 2 in the same byte 9 are structurally and electrically separate from those of the adjacent bytes, as brought out by FIG. 5.

The growth of field oxide 22 allows such common source regions 6 to be demarcated.

Then, the gate oxide is formed to different depths according to the different transistor types. For instance, a tunnel oxide 24 thickness of about 9 nm is preferred for the floating gate cells 2, while a thickness of about 20 nm would be appropriate for the selection transistors 5.

As for the transistors A and B of the source addressing line SL, the former may have a gate oxide 26 formed to either a thickness of 20 nm or 30 nm, for a low or a high voltage, while the latter transistor B is to withstand high voltages and requires a thickness of about 30 nm for the gate oxide 16. These thicknesses are given as examples based on a currently acceptable process and device size technology; the thicknesses are for example only and different values may be used within the invention, depending on the process and device size technology used.

In order to provide thicknesses so markedly different from one another, the method proceeds in steps, such as by growing a first oxide layer of about 24 nm onto the surface of the substrate 10.

This first layer is masked with a resist and etched in those areas where the low-voltage oxide is to be grown. The resist is then removed, and a second oxide layer of about 18 nm grown.

During this second growth, the depth of the first layer is also increased.

A subsequent masking step with a resist enables the high- and low-voltage oxide 16, 26 areas to be protected, and the oxide layer etched away in the tunnel areas. Removal of the resist and subsequent growth of the tunnel dielectric 24 bring to completion the thickness of the low- and high-voltage oxides 16 and 26 as well. Nothing forbids, of course, that a different procedure be used to provide such different oxide thickness.

The process continues with the deposition, doping, and photolithographic definition of the first polycrystalline silicon (polysilicon) layer 20 for the floating gates 12 of the cells 2. An interpoly dielectric layer 25 is formed over the first polysilicon layer 20.

Figure 3:
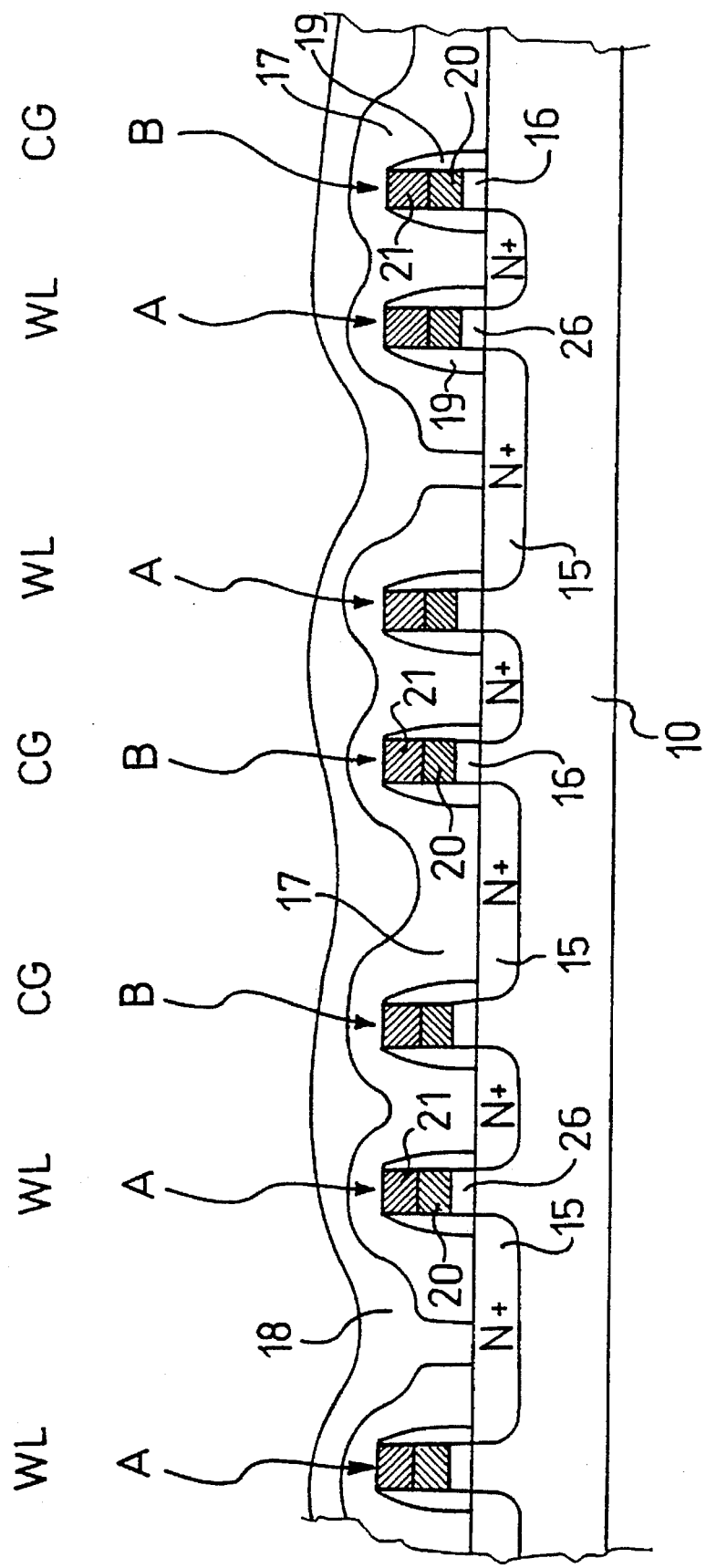
FIG. 3 is an enlarged schematic view in vertical section, taken along line III—III in FIG. 2, of a semiconductor portion in which the circuit of this invention is formed.

This interpoly layer 15 is removed, however, along the source addressing line SL shown in FIG. 3 to later obtain standard transistors A and B having no floating gates. The other areas of the matrix 1 are protected with a photoresist during this operation.

Moreover, the deposition and doping of a second polysilicon layer 21 will allow the formation of the control gates 8 and those of the selection transistors 5, as well as the gates of the enable transistors A and B.

Thereafter, the source and drain implantations are carried out for the cells 2, the selection transistors 5, and the active areas 15 of the transistors A and B, using at least one species of the N type.

The process is completed by subsequent steps in any acceptable manner, many acceptable techniques for these steps being known in the prior art, which provide:

spacers 19;

N- and P-channel transistors for the circuitry associated with the matrix 1; and an intervening dielectric 17 and a terminating metallization layer 18.

On the whole, the process just described has a major advantage in that it can be completed using no additional steps with respect to conventional methods.

The circuit structure of this invention, as obtained with the process described above, solves the following technical problems and affords the following advantages:

First, this Solution allows the programming to be handled for each individual byte even where negative voltages are used during the write phase.

The rise of a negative voltage at the control gate 8 allows the voltage applied to the drain terminal to be lowered while maintaining, across the thin oxide, an electric field equal to that provided in conventional cells. Thus, the deterioration of the thin tunnel oxide can be greatly reduced.

In addition, the use of a negative voltage at the control gate 8 of the cells 2 during the write phase allows the voltage requirement across the tunnel oxide for obtaining a desired programming current to be distributed.

The circuit of this invention can be integrated within a smaller area than a conventional cell of equal technology. Since the inventive cell works on the basis of a Fowler-Nordheim tunnel effect, and its intrinsic threshold may be selected close to zero, this structure suits low-voltage supply applications.

The memory cell herein described and illustrated may be altered and modified without departing from the invention scope as defined in the appended claims.

We claim:

1. A method for making a matrix of memory cells in MOS technology on a semiconductor substrate, the memory cells including floating gate transistors having active source and drain areas, each memory cell being connected to at least one enabling transistor and connected serially to a respective selection transistor, the method comprising the steps of:

(a) forming gate oxide layers for the selection transistors, the enabling transistors and the memory cells, the thickness of the gate oxide layers for the memory cells being different from the gate oxide layers for the selection and enabling transistors;

(b) after step (a), depositing and defining a first polysilicon layer over the gate oxide layers of the memory cells to form floating gates;

(c) forming an interpoly dielectric layer over the first polysilicon layer; and (d) depositing a second polysilicon layer to concurrently form gates for the selection and enabling transistors and control gates for the memory cells.

2. A method according to claim 1, further comprising the step of forming a plurality of common source areas for the memory cells, each of the common source areas being formed in common with source areas for a group of memory cells along a row, each of the common source areas being structurally independent from and electrically disconnected from source areas for other groups of memory cells in the same row.

3. A method for making a matrix of memory cells laid out in rows and columns, each of said memory cells connected to an associated selection transistor and at least one associated enabling transistor, the method comprising the following steps:

(a) defining a plurality of active areas on a substrate for said memory cells, selection transistors, and enabling transistors such that each memory cell shares an active area with said associated selection transistor and each memory cell shares an active area with said associated enabling transistor;

(b) growing a field oxide layer to demarcate a plurality of common source areas of said memory cells extending along rows of said matrix, a plurality of source addressing lines extending along columns of said matrix, a plurality of word lines extending along rows of said matrix, and a plurality of bit lines extending along columns of said matrix;

(c) forming gate oxide layers for said memory cells, said selection transistors, and said enabling transistors, the thickness of said gate oxide layers for said memory cells being different from said gate oxide layers for said selection and enabling transistors;

(d) after step (c), depositing, doping, and photolithographically defining a first polysilicon layer for floating gates of said memory cells;

(e) forming an interpoly dielectric layer over said first polysilicon layer;

(f) removing said interpoly layer along said source addressing lines;

(g) depositing and doping a second polysilicon layer to concurrently form gates for said associated enabling and selection transistors and control gates for said memory cells; and (h) concurrently implanting source and drain areas for said associated enabling and selection transistors and said memory cells.

4. A method of claim 3, further comprising between steps (b) and (d) the steps of:

(a) growing a first oxide layer onto the surface of said substrate;

(b) masking said first oxide layer with a resist and etching areas where oxides of said selection transistors are to be grown;

(c) removing said resist and growing a second oxide layer for oxides of said enabling transistors; and (d) masking said oxides for said selection and enabling transistors with a resist and etching tunnel areas for floating gates of said memory cells.

5. A method of claim 3, further comprising a step of forming a plurality of common source areas for said memory cells, each of said common source areas formed in common with source areas for a group of memory cells along a row, each of said common source areas structurally independent from and electrically disconnected from source areas for other groups of memory cells common to the same row.

6. A method for making a matrix of memory cells laid out in rows and columns, each of the memory cells connected to a selection transistor and to at least one enabling transistor, the method comprising the steps of:

(a) defining a plurality of active areas on a substrate;

(b) defining a plurality of common source areas of the memory cells, a plurality of source addressing lines, a plurality of word lines, and a plurality of bit lines;

(c) forming gate oxide layers for the memory cells, the selection transistors and the at least one enabling transistor, the thickness of the gate oxide layers for the memory cells being different from the gate oxide layers for the selection transistors and the at least one enabling transistor;

(d) after step (c), depositing, doping, and defining a first polysilicon layer for floating gates of the memory cells;

(e) forming an interpoly dielectric layer over the first polysilicon layer;

(f) depositing and doping a second polysilicon layer to concurrently form gates for the at least one enabling transistor and selection transistors, and control gates for the memory cells; and (g) implanting active areas concurrently for the at least one enabling transistor, selection transistors, and memory cells.

7. The method of claim 6 wherein said step of defining a plurality of common source areas of the memory calls extends the common source areas along rows of the matrix.

8. The method of claim 6 wherein said step of defining a plurality of source addressing lines extends the source addressing lines along columns of the matrix.

9. The method of claim 6 wherein said step of defining a plurality of word lines extends the word lines along rows of the matrix.

10. The method of claim 6 wherein said step of defining a plurality of bit lines extends the bit lines along columns of the matrix.

11. The method of claim 6 wherein said step of forming gate oxide layers forms gate oxide layers of first, second, and third thicknesses, the first thickness being for the selection transistors, the second thickness being for the enabling transistors, and the third thickness being for the memory cells.

12. The method of claim 11 wherein said step of forming gate oxide layers of first, second, and third thicknesses further comprises the steps of:

(a) growing a first oxide layer onto the surface of the substrate;

(b) masking the first oxide layer and etching areas where an oxide for the selection transistors are to be grown;

(c) removing the mask and growing a second oxide layer for the enabling transistors;

(d) masking oxide areas for the selection transistors and enabling transistors and etching tunnel areas for floating gates of the memory cells; and (e) removing the mask and growing a tunnel dielectric until the tunnel dielectric is at the third thickness, the oxide layer for the enabling transistors is at the second thickness, and the oxide for the selection transistors is at the first thickness.

13. The method of claim 6 wherein the step of defining a plurality of common source areas further comprises the step of:

growing a field oxide layer to define a plurality of common source areas for groups of memory cells along rows of the matrix, each common source area being structurally independent from and electrically disconnected from source areas for other groups of memory cells common to the stone row.

14. The method of claim 6 wherein step (b) includes the step of growing a field oxide layer.

15. The method of claim 6 wherein the step of defining a first polysilicon layer for floating gates of the memory cells comprises the step of photolithographically defining the first polysilicon layer.

16. The method of claim 12 wherein steps (b) and (d) are performed by masking with a resist.

17. The method of claim 6 further comprising between steps (e) and (f) the step of:

removing the interpoly layer along the source addressing lines.

18. A method for making a matrix of memory cells laid out in rows and columns, each of the memory cells connected to a selection transistor and to at least one enabling transistor, the method comprising the steps of:

(a) forming gate oxide layers for the selection transistors, the enabling transistors and the memory cells, the thickness of the gate oxide layers for the memory cells being different from the gate oxide layers for the selection and enabling transistors;

(b) after step (a), depositing and defining a first polysilicon layer to concurrently form floating gates and a first portion of gates for the selection and enabling transistors;

(c) forming an interpoly dielectric layer over the floating gates of the memory cells; and (d) depositing a second polysilicon layer to concurrently form control gates for the memory cells and a second portion of the gates for the selection and enabling transistors.

19. A method for making a matrix of memory cells laid out in rows and columns, each of the memory cells connected to a selection transistor and to at least one enabling transistor, the method comprising the steps of:

(a) forming gate oxide layers for the selection transistors, the enabling transistors and the memory cells, the thickness of the gate oxide layers for the memory cells being different from the gate oxide layers for the selection and enabling transistors;

(b) after step (a), depositing and defining a first polysilicon layer to form floating gates of the memory cells;

(c) forming an interpoly dielectric layer over the floating gates of the memory cells;

(d) removing the interpoly dielectric layer formed over the gate oxide layers for the selection and enabling transistors; and (e) forming control gates for the memory cells and gates for the selection and enabling transistors.

* * * * *